(12) United States Patent
Lenhard et al.

(10) Patent No.: US 8,067,974 B2
(45) Date of Patent: Nov. 29, 2011

(54) SIGNAL TRANSFORMATION ARRANGEMENT AND METHOD FOR SIGNAL TRANSFORMATION

(75) Inventors: Herbert Lenhard, Graz (AT); Josef Kriebernegg, Graz (AT); Fabien Boitard, Feldkirchen (AT)

(73) Assignee: austriamicrosystems AG, Unterpremstätten (AT)

( * ) Notice: Subject to any disclaimer, the term of this patent is extended or adjusted under 35 U.S.C. 154(b) by 71 days.

(21) Appl. No.: 12/531,670

(22) PCT Filed: Mar. 13, 2008

(86) PCT No.: PCT/EP2008/053029
§ 371 (c)(1),
(2), (4) Date: Mar. 11, 2010

(87) PCT Pub. No.: WO2008/113743
PCT Pub. Date: Sep. 25, 2008

(65) Prior Publication Data
US 2010/0214003 A1 Aug. 26, 2010

(30) Foreign Application Priority Data
Mar. 16, 2007 (EP) .................................. 07005488

(51) Int. Cl.
*G06G 7/16* (2006.01)
(52) U.S. Cl. ......................... 327/356; 327/337; 341/143
(58) Field of Classification Search .................. 327/100, 327/126, 337, 355–357, 361; 341/143, 172
See application file for complete search history.

(56) References Cited

U.S. PATENT DOCUMENTS

| | | | |
|---|---|---|---|
| 3,689,752 A | 9/1972 | Gilbert | |
| 3,889,263 A | 6/1975 | Johannessen | |
| 4,001,598 A | 1/1977 | Johannessen | |
| 4,151,528 A | 4/1979 | Johannessen | |
| 5,703,589 A * | 12/1997 | Kalthoff et al. | 341/172 |
| 5,821,891 A * | 10/1998 | Shi et al. | 341/143 |
| 5,847,594 A * | 12/1998 | Mizuno | 327/514 |
| 6,064,871 A * | 5/2000 | Leung | 455/323 |
| 6,172,631 B1* | 1/2001 | Tsai et al. | 341/143 |
| 6,400,295 B1* | 6/2002 | Van Herzeele | 341/143 |
| 7,043,222 B2 | 5/2006 | Wortel et al. | |
| 7,295,143 B2* | 11/2007 | Ambo et al. | 341/172 |
| 7,439,893 B2* | 10/2008 | Inukai et al. | 341/143 |
| 2005/0219065 A1* | 10/2005 | Holberg et al. | 341/1 |
| 2008/0268805 A1* | 10/2008 | Hsieh et al. | 455/293 |
| 2010/0309032 A1* | 12/2010 | Uo et al. | 341/110 |

OTHER PUBLICATIONS

U. Tietze et al., "Halbleiterschaltungstechnik", Springer Verlag, Berlin, pp. 1463-1464, 2002.

* cited by examiner

*Primary Examiner* — Lincoln Donovan
*Assistant Examiner* — William Hernandez
(74) *Attorney, Agent, or Firm* — Cozen O'Connor

(57) ABSTRACT

A signal transformation arrangement comprises a first input tap (1) to receive a first input signal (IN_P), a first output terminal (3) to provide a first output signal (OUT_P) and a first coupling circuit (10) which couples the first input tap (1) to a first energy storing device (11) depending on a first clock signal (CLK_1) and which couples the first energy storing device (11) to the first output terminal (3) depending on a first inverted clock signal (XCLK_1). The signal transformation arrangement further comprises a second coupling circuit (20) which couples the first input tap (1) to a second energy storing device (21) depending on a second clock signal (CLK_2) and which couples the second energy storing device (21) to the first output terminal (3) depending on a second inverted clock signal (XCLK_2).

15 Claims, 4 Drawing Sheets

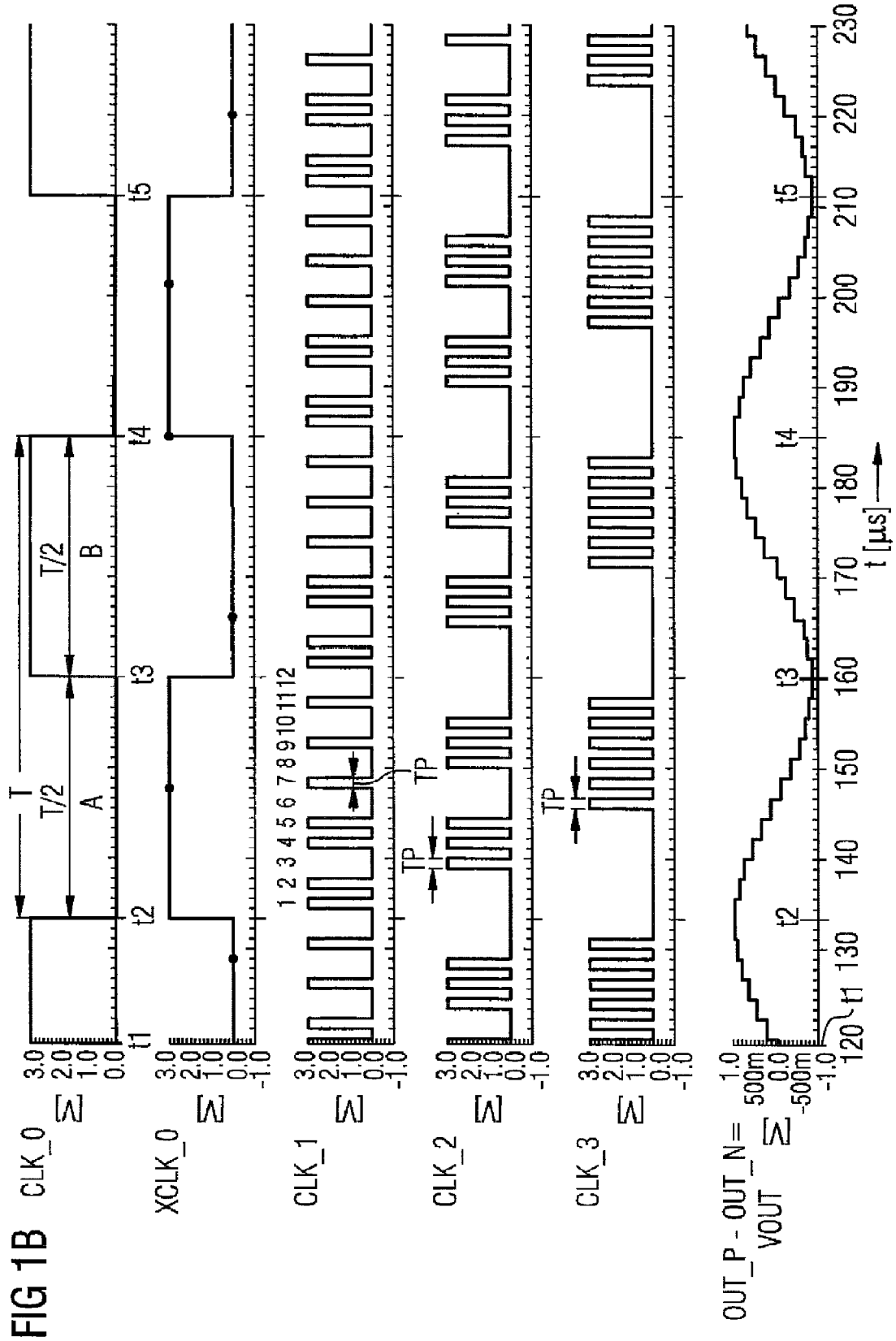

SIGNAL TRANSFORMATION ARRANGEMENT AND METHOD FOR SIGNAL TRANSFORMATION

RELATED APPLICATIONS

This is a U.S. national stage of application No. PCT/EP2008/053029, filed on Mar. 13, 2008.

This application claims the priority of European application no. 07005488.7 filed Mar. 16, 2007, the entire content of which is hereby incorporated by reference.

FIELD OF THE INVENTION

The present invention relates to a signal transformation arrangement, a modulation arrangement and a method for signal transformation.

BACKGROUND OF THE INVENTION

A widely used embodiment of a signal transformation arrangement is a mixer. Up- or down-mixing is used to convert a signal between radio frequency and base-band level. In addition to an input signal, a local oscillator signal may be applied to the mixer. The input signal is often processed in the mixer by a multiplication with an ideal sine-wave local oscillator signal.

Document U.S. Pat. No. 7,043,222 B2 shows a modulator using up-mixers and sine-wave coded digital-analog converters.

SUMMARY OF THE INVENTION

It is an object of the present invention to provide a signal transformation arrangement, a modulator arrangement and a method for signal transformation which provide higher flexibility.

In accordance with an embodiment of the invention, a signal transformation arrangement comprises a first input tap, a first coupling circuit, a second coupling circuit and a first output tap. The first coupling circuit comprises a first energy storing device and the second coupling circuit comprises a second energy storing device.

A first input signal is received at the first input tap. The first coupling circuit couples the first input tap to the first energy storing device depending on a first clock signal. Further on, the first coupling circuit also couples the first energy storing device to the first output terminal depending on a first inverted clock signal. The first inverted clock signal is an inverted signal compared to the first clock signal. Correspondingly, the second coupling circuit couples the first input tap to the second energy storing device depending on a second clock signal. Moreover, the second coupling circuit also couples the second energy storing device to the first output terminal depending on a second inverted clock signal. The second inverted clock signal is an inverted signal compared to the second clock signal. A first output signal is provided at the first output terminal.

It is an advantage of the signal transformation arrangement that two energy storing devices are used for the coupling of the first input tap to the first output terminal. Therefore, there is no direct connection of the first input tap to the first output terminal. Using the first and the second clock signals, a high flexibility is achieved at which points of time the first input signal is sampled. Providing two energy storing devices results in a first output signal being a smoothed signal in comparison to a purely sampled input signal. It is a further advantage of the signal transformation arrangement that the first and the second clock signals can be provided as digital signals.

In an embodiment, the signal transformation arrangement comprises at least one further coupling circuit. The at least one further coupling circuit comprises at least one further energy storing device. Moreover, the at least one further coupling circuit couples the first input tap to the at least one further energy storing device depending on at least one further clock signal. It also couples the at least one further energy storing device to the first output terminal depending on at least one further inverted clock signal. The at least one further inverted clock signal is an inverted signal to the at least one further clock signal. Thus, the first output signal can be generated with an even increased flexibility. The at least one further clock signal preferably is a digital signal.

In an embodiment, the first and the second clock signals are generated by means of a common clock signal. The at least one further clock signal is preferably also derived from the common clock signal.

In an embodiment, the first energy storing device comprises a first capacitor and the second energy storing device similarly comprises a second capacitor. In a further development, the at least one further energy storing device comprises at least one further capacitor. The first input signal is preferably a voltage signal. The capacitors of the energy storing devices advantageously sample the first input signal. The sampling is performed by charging and de-charging of the capacitors.

In a preferred embodiment, the capacitance value of the first capacitor is different from the capacitance value of the second capacitor. In a further development, the capacitance value of the at least one further capacitor differs from the capacitance values of the first and the second capacitors.

In a further development, the first coupling circuit comprises a first and a second switch. The first switch couples the first input tap to a first electrode of the first capacitor and the second switch couples the first electrode of the first capacitor to the first output terminal. The second coupling circuit similarly comprises a third and a fourth switch. The third switch couples the first input tap to a first electrode of the second capacitor and the fourth switch couples the first electrode of the second capacitor to the first output terminal. Correspondingly, the at least one further coupling circuit preferably comprises a further switch and an additional switch. The further switch couples the first input tap to a first electrode of the at least one further capacitor and the additional switch couples the first electrode of the at least one further capacitor to the first output terminal.

The first clock signal is provided to a control terminal of the first switch. The first inverted clock signal is provided to a control terminal of the second switch. Similarly, the second clock signal is applied to a control terminal of the third switch and the second inverted clock signal is applied to a control terminal of the fourth switch. Correspondingly, the at least one further clock signal is provided to a control terminal of the further switch and the at least one further inverted clock signal is applied to a control terminal of the additional switch. Because the first and the second switches are not closed both at one point of time, a direct connection between the first input tap and the first output tap is advantageously avoided. Further on, the third and the fourth switches are also not closed both at one point of time. The further switch and the additional switch similarly are not closed both at one point of time.

In a further development, the signal transformation arrangement comprises a second input tap and a second output terminal. The first coupling circuit couples the second input tap to a second electrode of the first capacitor depending on the first clock signal. The first coupling circuit also couples the second electrode of the first capacitor to the second output terminal depending on the first inverted clock signal. Correspondingly, the second coupling circuit couples the second input tap to a second electrode of the second capacitor depending on the second clock signal. The second coupling circuit also couples the second electrode of the second capacitor to the second output terminal depending on the second inverted clock signal. A second input signal is received at the second input tap and a second output signal is provided at the second output terminal. The second input signal can be a complementary signal to the first input signal or a differential signal with respect to the first input signal. The second output signal can be a complementary signal to the first output signal or a differential signal with respect to the first output signal. A symmetrical signal transformation of the first and the second input signals is advantageously achieved using this embodiment.

The signal transformation arrangement can be designed for a symmetric signal sine shaping transformation.

In a further embodiment, the at least one further coupling circuit additionally couples the second input tap to a second electrode of the at least one further capacitor depending on the at least one further clock signal. The at least one further coupling circuit also couples the second electrode of the at least one further capacitor to the second output terminal depending on the at least one further inverted clock signal.

In an embodiment, the signal transformation arrangement comprises an output energy storing device. The output storing device is coupled to the first output terminal. The output storing device can comprise an output capacitor. The output capacitor can be coupled to the first output terminal. The first and the second output signals are advantageously produced by the charge transfer between the first capacitor and the output capacitor and the charge transfer between the second capacitor and the output capacitor. Additionally, the two output signals are advantageously generated by the charge transfer between the at least one further capacitor and the output capacitor.

In a further development, the signal transformation arrangement comprises a first and a second input terminal and a cross-coupler. The cross-coupler couples the first input terminal to the first input tap depending on a cross-coupler signal. The cross-coupler also couples the second input terminal to the first input tap depending on an inverted cross-coupler signal. The inverted cross-coupler signal is an inverted signal compared to the cross-coupler signal. A first signal is received at the first input terminal. A second signal is received at the second input terminal. By means of the cross-coupler, either the first signal or the second signal is applied to the first input tap as the first input signal at one point of time. The cross-coupler advantageously performs an inverting of a voltage difference between the first input signal and the second input signal at one point of time and a transfer of the voltage difference at another point of time.

In a further development, the cross-coupler couples the first input terminal to the second input tap depending on the inverted cross-coupler signal and also couples the second input terminal to the second input tap depending on the cross-coupler signal. Therefore, the first signal is either provided to the first input tap or to the second input tap at a point of time and the second signal is also either provided to the second input tap or the first input tap at the point of time. The cross-coupler signal and, therefore, also the inverted cross-coupler signal are digital signals. Therefore, the cross-coupler is realized as a digital mixer. Using the first, the second and/or the at least one further coupling circuits, results in smoothed first and second input signals. Smoothing of the first and the second output signals leads to two analog output signals. A sine-shaper network comprises the first, the second and/or the at least one further coupling circuits. If the first signal equals a value 1 and the second signal equals a value 0, a first output signal can be generated having a sine-wave form by the signal transformation arrangement. This can be achieved even if the cross-coupler signal, the first, the second and the at least one further clock signal are digital signals. The digital signals are value discrete signals. The digital signals may also be time discrete signals. The digital signals preferably are binary signals.

The first, the second and the at least one further coupling circuit together comprise a switched capacitor circuit.

The signal transformation arrangement can be used for down-mixing. Preferably, the signal transformation arrangement is used for up-mixing.

In a preferred embodiment, the signal transformation arrangement is realized using a semiconductor body to which the output capacitor, the first, the second and the at least one further capacitor are coupled. No coil is advantageously comprised by the signal transformation arrangement.

In an alternative embodiment, the semiconductor body comprises also the output capacitor, the first, the second and the at least one further capacitor. It is an advantage that no external component is foreseen for the realization of the alternative embodiment.

According to an embodiment, a method for signal transformation comprises receiving a first input signal and providing the first input signal to a first energy storing device and a second energy storing device. The first input signal is applied to the first energy storing device depending on a first clock signal and is applied to the second energy storing device depending on a second clock signal. The method comprises to provide a first output signal which depends on the energy stored in the first energy storing device as well as on the energy stored in the second energy storing device. The first output signal is generated using the energy stored in the first energy storing device depending on a first inverted clock signal and as well as using the energy stored in the second energy storing device depending on a second inverted clock signal.

In a further development, a first and a second signal are received. The first input signal is generated depending on the first signal and a cross-coupler signal as well as depending on the second signal and an inverted cross-coupler signal. The inverted cross-coupler signal is an inverted signal to the cross-coupler signal.

In an embodiment, the first signal is provided as the first input signal when the cross-coupler signal has a first logical value. The second signal is provided as the first input signal when the inverted cross-coupler signal has the first logical value. The inverted cross-coupler has the first logical value, if the cross-coupler signal has a second logical value. The second logical value is inverted with respect to the first logical value.

It is an advantage of the method for signal transformation that a high flexibility is achieved because two energy storing devices are used for sampling of the first input signal. A smoothed first output signal is generated using energies stored in the first and the second energy storing device.

In an embodiment, the first and the second clock signals are digital signals. The first and the second clock signals are preferably generated using a common clock signal.

BRIEF DESCRIPTION OF THE DRAWINGS

The following description of figures of exemplary embodiments may further illustrate and explain the invention. Devices with the same structure and the same effect respectively appear with equivalent reference numerals. A description of a part of a circuit or device having the same function in different figures might not be repeated in every of the following figures.

FIGS. 1A and 1B show an exemplary embodiment of a signal transformation arrangement and the corresponding signals of the invention.

DETAILED DESCRIPTION OF THE DRAWINGS

Figure 1A:
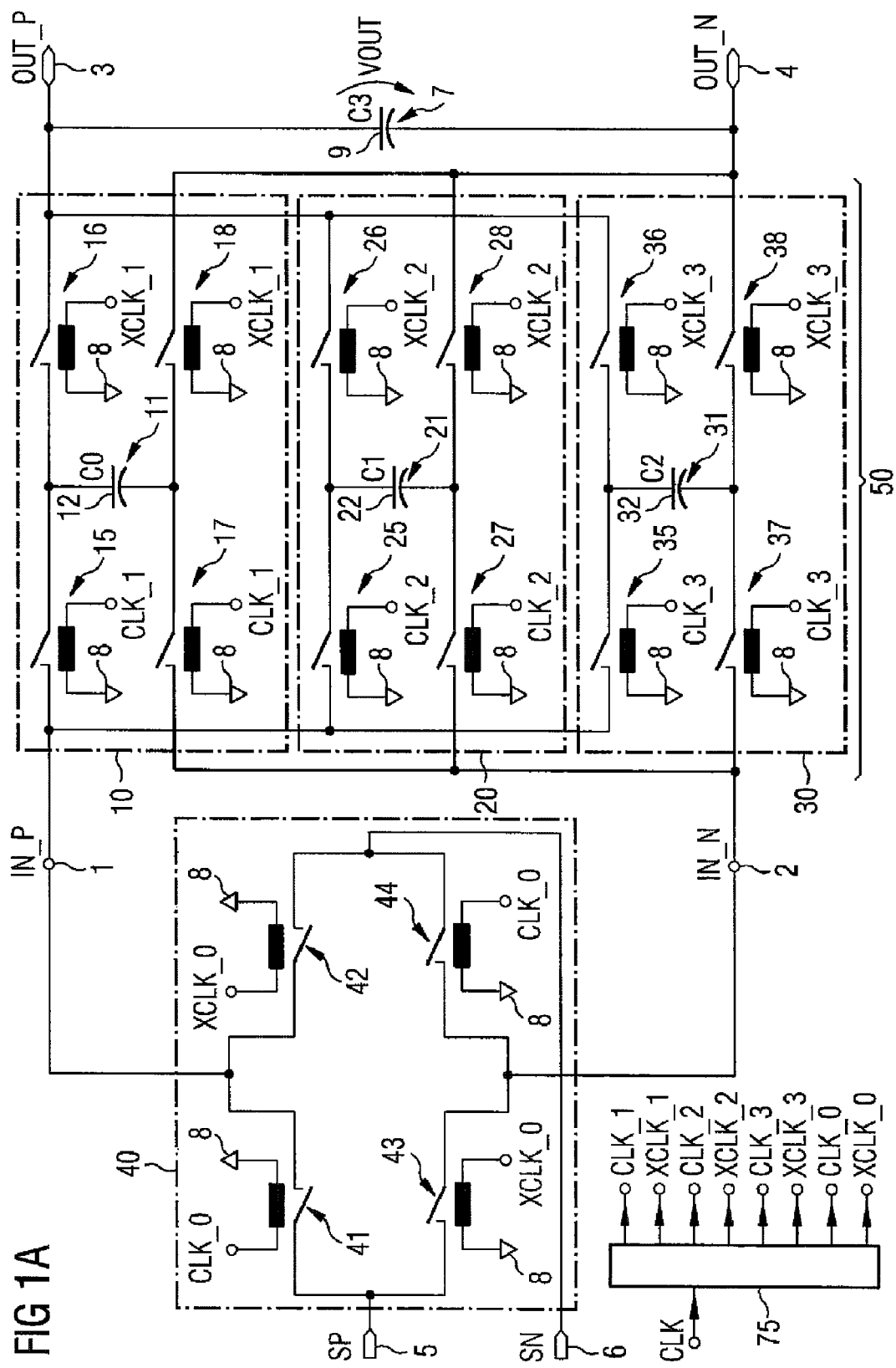

FIG. 1A shows an exemplary embodiment of a signal transformation arrangement of the invention. The signal transformation arrangement comprises a first and a second input tap 1, 2, a first, a second and a third coupling circuit 10, 20, 30 and a first and a second output terminal 3, 4. The first coupling circuit 10 is connected on its input side to the first and the second input tap 1, 2. The first coupling circuit 10 is connected on its output side to the first and the second output terminal 3, 4. Correspondingly, the second and the third coupling circuit 20, 30 are coupled on their input sides to the first and the second input taps 1, 2 and on their output sides to the first and the second output terminals 3, 4. The first coupling circuit 10 comprises a first and a second switch 15, 16 and a first energy storing device 11 which contains a first capacitor 12. A first electrode of the first capacitor 12 is connected to the first input tap 1 via the first switch 15 and to the output terminal 3 via the second switch 16. Correspondingly, the second and the third coupling circuits 20, 30 comprise a second and a third energy storing device 21, 31. The second energy storing device 21 contains a second capacitor 22 and the third energy storing device 31 contains a third capacitor 32. The second coupling circuit 20 comprises a third and a fourth switch 25, 26. A first electrode of the second capacitor 22 is connected to the first input tap 1 via the third switch 25 and to the output terminal 3 via the fourth switch 26. The third coupling circuit 30 similarly comprises a fifth and a sixth switch 35, 36. A first electrode of the third capacitor 32 is connected to the first input tap 1 via the fifth switch 35 and to the output terminal 3 via the sixth switch 36. The first coupling circuit 10 also comprises a seventh and an eighth switch 17, 18. A second electrode of the first capacitor 12 is connected to the second input tap 2 via the seventh switch 17 and to the second output terminal 4 via the eighth switch 18. Correspondingly, the second coupling circuit 20 comprises a ninth and a tenth switch 27, 28. The ninth switch 27 couples the second input tap 2 to the second electrode of the second capacitor 22 and the tenth switch 28 couples the second electrode of the second capacitor 22 to the second output terminal 4. Correspondingly, the third coupling circuit 30 comprises an eleventh and a twelfth switch 37, 38. The eleventh switch 37 couples the second input tap 2 to a second electrode of the third capacitor 32 and the twelfth switch 38 couples the second electrode of the third capacitor 32 to the second output terminal 4. The signal transformation arrangement also comprises an output energy storing device 7 which couples the first output terminal 3 to the second output terminal 4. The output energy storing device 7 contains an output capacitor 9. The first, the second and the third coupling circuits 10, 20, 30 together comprise a sine-shaper network 50. The sine-shaper network 50 uses a switched capacitor technique. The first, the second and the third capacitors 12, 22, 32 are binary weighted capacitors. The third capacitor 32 approximately has double the capacitance value of the second capacitor 22 and the second capacitor 22 approximately has double the capacitance value of the first capacitor 12.

The signal transformation arrangement further comprises a first and a second input terminal 5, 6 and a cross-coupler 40. The cross-coupler 40 is connected on its input side to the first and the second input terminals 5, 6 and on its output side to the first and the second input tap 1, 2. The cross-coupler 40 comprises a first cross-coupler switch 41 which couples the first input terminal 5 to the first input tap 1. The cross-coupler 40 also comprises a second cross-coupler switch 42 which couples the second input terminal 6 to the first input tap 1. A third cross-coupler switch 43 of the cross-coupler 40 couples the first input terminal 5 to the second input tap 2. Similarly, a fourth cross-coupler switch 44 of the cross-coupler 40 couples the second input terminal 6 to the second input tap 2. The signal transformation arrangement also comprises a timing circuit 75 which is connected on its output side to the control terminals of the first to the twelfth switches 15 to 18, 25 to 28, 35 to 38 and to the first to the fourth cross-coupler switches 41 to 44. The connection lines of the timing circuit 75 to the control terminals of the switches are not shown in FIG. 1A for easier understanding.

A first signal SP is applied to the first input terminal 5 and a second signal SN is applied to the second input terminal 6. The cross-coupler 40 generates on its output side a first input signal IN_P and a second output signal IN_N which are applied to the first and the second input taps 1, 2, respectively. The first, the second and the third coupling circuits 10, 20, 30 generate a first output signal OUT_P which is applied to the first output terminal 3 and also a second output signal OUT_N which is applied to the second output terminal 4. The timing circuit 75 receives a common clock signal CLK and generates a cross-coupler signal CLK_0 and an inverted cross-coupler signal XCLK_0 which is an inverted signal to the cross-coupler signal CLK_0, using the common clock signal CLK. The cross-coupler signal CLK_0 is provided to the control terminals of the first and the fourth cross-coupler switches 41, 44. Correspondingly, the inverted cross-coupler signal XCLK_0 is provided to the control terminals of the second and the third cross-coupler switches 42, 43. The timing circuit 75 also generates a first clock signal CLK_1 and a first inverted clock signal XCLK_1 which is an inverted signal to the first clock signal CLK_1 using the common clock signal CLK. The first clock signal CLK_1 is applied to the control terminals of the first and the seventh switches 15, 17. The inverted first clock signal XCLK_1 is applied to the control terminals of the second and the eighth switches 16, 18. Correspondingly, the timing circuit 75 also generates a second clock signal CLK_2 and an inverted second clock signal XCLK_2 which is an inverted signal in comparison to the second clock signal CLK_2. The second clock signal CLK_2 is put on the control terminals of the third and the ninth switches 25, 27. Correspondingly, the second inverted clock signal XCLK_2 is put on the control terminals of the fourth and the tenth switches 26, 28. In a similar way, the timing circuit 75 generates a third clock signal CLK_3 and an inverted third clock signal XCLK_3 which is an inverted signal compared to the third clock signal CLK_3. The third clock signal CLK_3 is provided to the control terminals of the fifth and the eleventh switches 35, 37 and the inverted third clock signal CLK_3 is provided to the control terminals of the sixth and the twelfth switches 36, 38. The signals are explained in more detail using FIG. 1B.

FIG. 1B shows an exemplary embodiment of the timing schedules of the signals in the signal transformation arrangement shown in FIG. 1A of the invention. FIG. 1B shows the cross-coupler signal CLK_0, the inverted cross-coupler signal XCLK_0, the first, the second and the third clock signal CLK_1, CLK_2, CLK_3 and a voltage difference VOUT versus the time t. The voltage difference VOUT is the difference of the first output signal OUT_P and the second output signal OUT_N. The cross-coupler signal CLK_0, the first, the second and the third clock signals CLK_1, CLK_2, CLK_3 are digital signals. The cross-coupler signal CLK_0 is repeated with a cycle duration T. The duty cycle of the cross-coupler signal CLK_0 is 50%. The cross-coupler signal CLK_0 has a digital value of one which corresponds to a analog value of 3 V between a first point of time t1 and a second point of time t2, between a third point of time t3 and a fourth point of time t4 and also after a fifth point of time t5. The cross-coupler signal CLK_0 has a logical value 0 corresponding to an analog value of 0 V between the second point t2 and the third point t3 and also between the fourth point t4 and the fifth point t5. A first half A of the cycle is between the second point t2 and the third point t3; a second half B of the cycle is between the third point t3 and the fourth point t4. The cross-coupler signal CLK_0 and the inverted cross-coupler signal XCLK_0 are two non-overlapping signals. Therefore, the first signal SP is provided to the first input tap 1 during the second half B of the cycle and to the second input tap 2 during the first half A. The second signal SN is provided to the first input tap 1 during the first half A and to the second input tap 2 during the second half B. In a consequence, the second signal SN is applied to the first input tap 1 only while the first signal SP is not applied to the first input tap 1 and is applied to the second input tap 2 only while the first signal SP is not applied to the second input tap 2.

The first clock signal CLK_1 comprises seven pulses in the first half A and also seven pulses in the second half B which have an equal time flow in comparison to the seven pulses in the first half A. This means that the seven pulses of the first clock signal CLK_1 in the first half A are repeated with a cycle duration which equals T/2. During the pulses of the first clock signal CLK_1 the first and the seventh switches 15, 17 are switched on so that the first and the second input signal IN_P, IN_N are applied to the first electrode and to the second electrode, respectively, of the first capacitor 12. The first capacitor 12 is not connected to the output capacitor 9 during these seven pulses. After the end of each of the seven pulses, the first capacitor 12 is directly connected to the output capacitor 9 via the second and the eighth switches 16, 18. The first and the second output signals OUT_P, OUT_N depend on the voltage of the first capacitor 12 and the points of time at which the second and the eighth switches 16, 18 are switched on and the voltage of the output capacitor 9 before these points of time.

The second clock signal CLK_2 comprises six pulses in the first half A and also six pulses in the second half B which have the same time flow in comparison to the six pulses in the first half A. During the six pulses, the first and the second input signals IN_P, IN_N are provided to the first and the second electrode of the second capacitor 22. After each of the six pulses the second capacitor 22 is directly connected to the output capacitor 9. Therefore, the first and the second output signals OUT_P, OUT_N also depend on the voltage which is stored by the second capacitor 22 and of the points of the six pulses of the second clock signal CLK_2. The third clock signal CLK_3 also comprises six pulses in the first half A and also six pulses in the second half B which have the same time flow in comparison to the six pulses in the first half A. The times are controlled during which the first and the second input signals IN_P, IN_N are applied to the third capacitor 32 and during which the third capacitor 32 is directly connected to the output capacitor 9 by the pulses of the third clock signal CLK_3. The pulses of the first, the second and the third clock signals CLK_1, CLK_2, CLK_3 have approximately the same time duration TP. The first half A can be divided into twelve equal time units. The first clock signal CLK_0 comprises pulses during the first, the second, the fourth, the fifth, the seventh, the ninth and the eleventh time unit. The second clock signal CLK_2 comprises pulses during the third, the fourth, the fifth, the eighth, the ninth and the tenth time unit. The third clock signal CLK_3 comprises pulses during the sixth to the eleventh time unit. Three of the pulses of the first clock signal CLK_1 and of the second clock signal CLK_2 are equal in the first half A. Also three of the pulses of the second clock signal CLK_2 are equal to three pulses of the third clock signal CLK_3 in the first half A. This leads to a parallel connection of the first, the second and/or the third capacitor 12, 22, 32 to the output capacitor 9. Using this parallel connection a high amount of energy can be provided to the output capacitor 9.

If the first signal SP has a value of 1 V and the second signal SN has a value of 0 V than the voltage difference UOUT is an analog signal and has a form of a sine-wave which is shown in FIG. 1B. The cycle duration of the sine-wave is the cycle duration T. The voltage difference VOUT comprises only some minor steps which can be seen in the time flow.

The cross-coupler 40 provides an up-mixing of the first and the second signals SP, SN with a rectangular shaped oscillator signal in the form of the cross-coupler signal CLK_0 and the inverted cross-coupler signal XCLK_0. The sine-shaping of the first and the second output signals OUT_P, OUT_N is achieved by controlling the charge transfer from the first and the second input taps 1, 2 to the output capacitor 9.

Therefore, a multiplication of the first and the second signal SP, SN via a sine-wave clock signal can be advantageously replaced by the signal transformation arrangement shown in FIG. 1A using a digital common clock signal CLK. The signal transformation arrangement performs an up-mixing using pure digital clock signals. The power consumption of the signal transformation arrangement has a low value.

Alternatively, a signal transformation arrangement also comprises at least one further coupling circuit.

In an embodiment, the voltage difference VOUT can be measured between the first output terminal 3 and the second output terminal 4. The other signals can be provided with reference to the reference potential terminal 8.

In an alternative embodiment which is not shown, the four cross-coupler switches 41 to 44 are combined with the twelve switches 15 to 18, 25 to 28, 35 to 38 of the first, the second and the third coupling circuits 10, 20, 30. More specifically, the four cross-coupler switches 41 to 44 would be combined with the twelve switches of the first, the second and the third coupling circuits 10, 20, 30 such that the first switch 15 couples the first input terminal 5 to the first electrode of the first capacitor 12. A further first switch couples the second input terminal 6 to the first electrode of the first capacitor 12.

Moreover, the seventh switch 17 couples the first input terminal 5 to the second electrode of the first capacitor 12. A further seventh switch couples the second input terminal 6 to the second electrode of the first capacitor 12. The second and the third coupling circuits 20, 30 are changed in the same manner.

Thus, the cross-coupler 40 is omitted and the first electrode of the first capacitor 12, the second electrode of the first capacitor 12, the first electrode of the second capacitor 22, the second electrode of the second capacitor 22, the first electrode of the third capacitor 32 as well as the second electrode of the third capacitor 32 are each coupled via separate switches to the first input terminal 5 and via separate switches to the second input terminal 6 of the circuit of FIG. 1A. The clock signals of the switches have to be generated so that the cross-coupler 40 can be omitted. Thus, the circuit which is an alternative embodiment of the circuit of FIG. 1A would comprise 18 switches. This combination reduces the overall resistance because only one switch connects the first input terminal 5 to the first electrode of the first capacitor 12.

Figure 2:
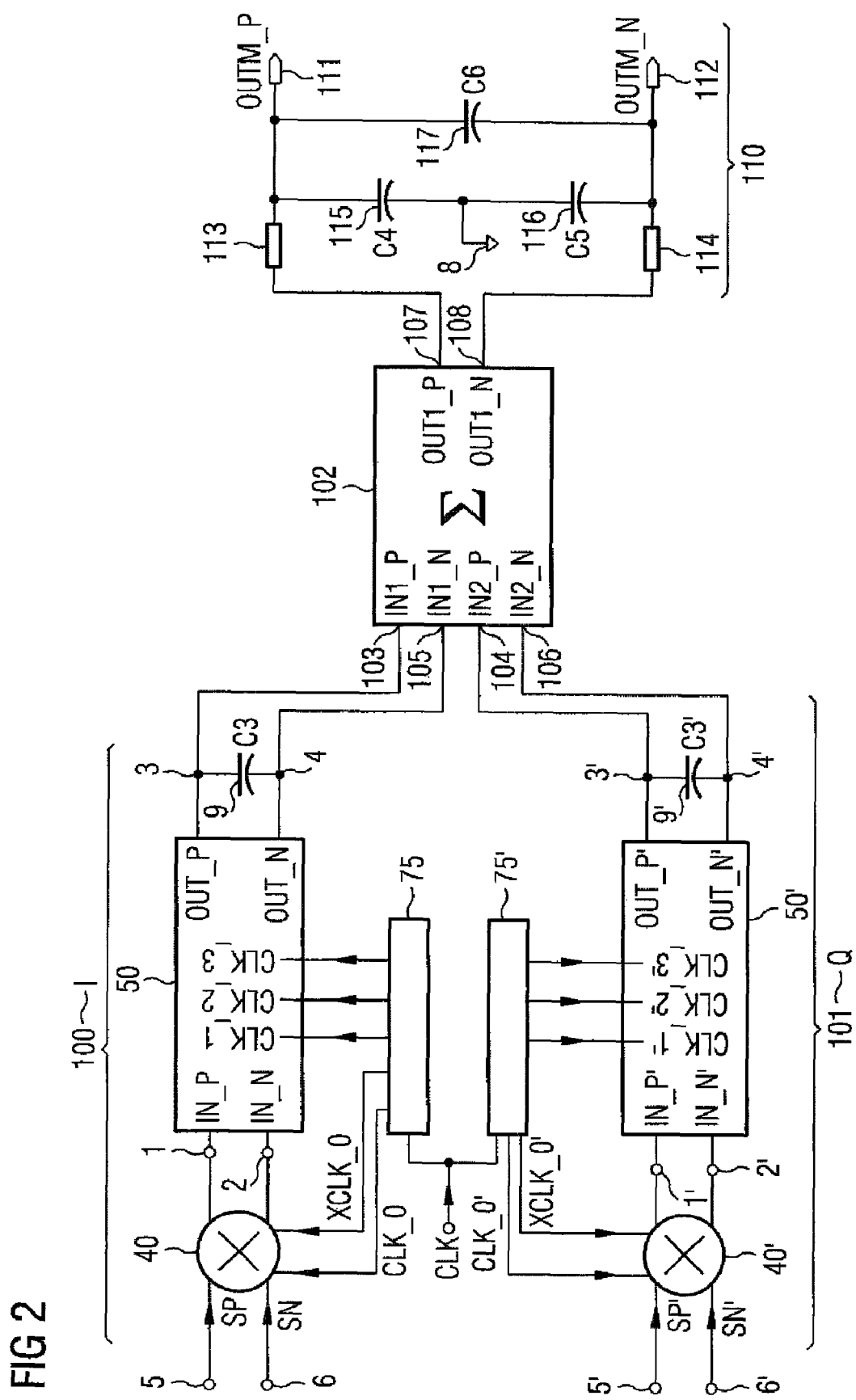
FIG. 2 shows an exemplary embodiment of a modulator comprising a signal transformation arrangement of the invention.

FIG. 2 shows an exemplary embodiment of a modulator which comprises a signal transformation arrangement 100 and a further signal transformation arrangement 101 of the invention. The signal transformation arrangement shown in FIG. 1A can be inserted as the signal transformation arrangement 100 and the further signal transformation arrangement 101. The modulation arrangement further comprises a summation stage 102. A first input 103 of the summation stage 102 is connected to the first output terminal 3 of the signal transformation arrangement 100. A second input 104 of the summation stage 102 is connected to a first output terminal 3' of the further signal transformation arrangement 101. Correspondingly, a third and a fourth input 105, 106 of the summation stage 102 are connected to the second output terminal 4 of the signal transformation arrangement 100 and to a second output terminal 4' of the further signal transformation arrangement 101. The summation stage 102 comprises a first and a second summation output 107, 108. The modulation arrangement also comprises a passive network 110 which couples the first summation and the second summation output 107, 108 to a first and a second modulator output terminal 111, 112. The passive network 110 comprises a first resistor 113 which connects the first summation output 107 to the first modulator output terminal 111. The passive network 110 also comprises a second resistor 114 which correspondingly couples the second summation output 108 to the second modulator output terminal 112. The passive network 110 also comprises a first and a second network capacitor 115, 116 which couple the first modulator output terminal 111 to a reference potential terminal 8 and the second modulator output terminal 112 to the reference potential terminal 8, respectively. The passive network 110 also comprises a third network capacitor 117 which is arranged between the first and the second modulator output terminals 111, 112. The passive network 110 works as a filter. The passive network 110 comprises a low-pass filter characteristic.

The first and the second signal SP, SN are provided to the first and the second input terminals 5, 6 of the signal transformation arrangement 100. These two signals are in-phase signals. Quadrature signals SP', SN', which correspond to the two in-phase signals SP, SN, are applied to a first and a second input terminal 5', 6' of the further signal transformation arrangement 101. Therefore, the signal transformation arrangement 100 deals with the modulation of the in-phase signals SP, SN while the further signal transformation arrangement 101 is foreseen for the modulation of the quadrature signals SP', SN'. The cross-coupler signal CLK_0' and the first, the second and the third clock signals CLK_1', CLK_2', CLK_3' for the further signal transformation arrangement 101 are provided with a phase delay of 90° with respect to the cross-coupler signal CLK_0 and the first, the second and the third clock signal CLK_1, CLK_2, CLK_3 which are applied to the signal transformation arrangement 100. The output signals OUT_P, OUT_N, OUT_P', OUT_N' of the two signal transformation arrangements 100, 101 are provided to the summation stage 102. A first summation output signal OUT1_P and a second summation output signal OUT1_N are generated by the summation stage 102 using the output signals OUT_P, OUT_N, OUT_P', OUT_N' of the two signal transformation arrangements 100, 101. The first and the second summation output signal OUT1_P, OUT1_N are filtered by the passive network 110, so that a first modulated signal OUTM_P is provided to the first modulator output terminal 111 and a second modulator output signal OUTM_N is provided to the second modulator output terminal 112.

The modulator can be used in a quadrature phase-shift keying re-modulation stage. In an exemplary embodiment, in-phase signals SP, SN and quadrature signals SP', SN' with a band-width of up to 2.5 KHz are provided to the signal transformation arrangement 100 and the further signal transformation arrangement 101. The first and the second output modulator signal OUTM_P, OUTM_N are provided as quadrature phase-shift keying signals with a carrier frequency of 19.2 KHz.

In case that the signal of the modulator is fed to a comparator for further digital signal processing the points of time of zero-crossings can be critical. The error of the digital signals can occur in the form of a time-uncertainty. It is an advantage of the signal transformation arrangement and the modulator of the principle presented that the time uncertainty can clearly be reduced by means of the sine-shaped output modulator signals OUTM_P, OUTM_N.

In an embodiment, the values C3 and C3' of the output capacitors 9, 9' are six times of a value of a unit capacitor. The values C4 and C5 of the first and the second network capacitors 115, 116 are twice of the value of the unit capacitor. A value C6 of the third network capacitor 117 is four times of the value of the unit capacitor.

In an embodiment which is not shown, the two modulator output signals OUTM_P, OUTM_N can be further applied to an amplifier stage and to an antenna for radio communication.

Figure 3A:
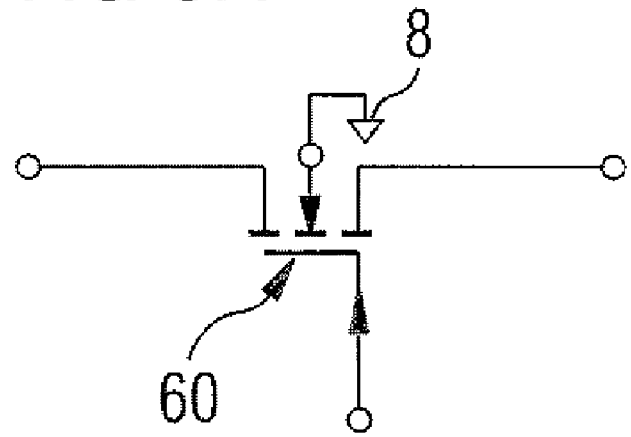
FIGS. 3A and 3B show exemplary embodiments of switches which can be used in the signal transformation arrangement of the invention.

FIG. 3A shows an exemplary embodiment of a switch which can be inserted as the first to the fourth cross-coupler switch 41 to 44 or the first to the twelfth switch of the first, the second and the third coupling circuits 10, 20, 30 in the signal transformation arrangement shown in the FIGS. 1A and 2. The switch comprises a transistor 60. The transistor 60 is realized as a field-effect transistor. The transistor 60 is preferably designed as a n-channel metal-oxide-semiconductor field-effect transistor. The transistor 60 comprises a control terminal which is connected to the control terminal of the switch and to which the corresponding clock signal is provided.

Alternatively, the transistor 60 is realized as a p-channel metal-oxide-semiconductor field-effect transistor.

Figure 3B:
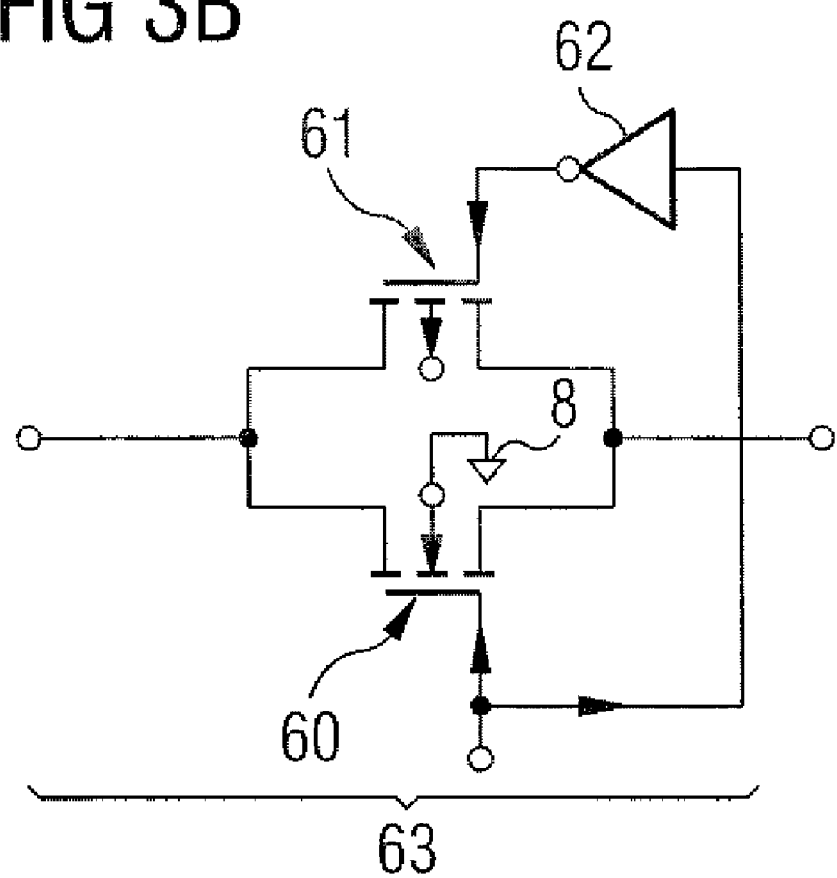

FIG. 3B shows an alternative embodiment of a switch which is a further embodiment of the switch shown in FIG. 3A and which can be inserted in the signal transformation arrangement shown in the FIGS. 1A and 2. The switch is designed as a transmission gate 63. The transmission gate 63 comprises the transistor 60, a further transistor 61 and an inverter 62. The controlled sections of the transistor 60 and the further transistor 61 are connected in parallel. The control terminal of the switch is directly connected to the control terminal of the transistor 60 and is connected to a control terminal of the further transistor 61 via the inverter 62.

It is an advantage of the transmission gate 63 that a low on-resistance value of the switch can be achieved. The on-resistance value of the switch is independent of the voltages applied at the two terminals of the controlled sections of the two transistors 60, 61.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A signal transformation arrangement, comprising:
   a cross-coupler which couples
       a first input terminal at which a first signal is received to a first input tap depending on a cross-coupler signal, and
       a second input terminal at which a second signal is received to
       the first input tap depending on an inverted cross-coupler signal
       which is an inverted signal to the cross-coupler signal;
   the first input tap to receive a first input signal;
   a first output terminal to provide a first output signal;
   a first coupling circuit which couples the first input tap to a first energy storing device depending on a first clock signal and which couples the first energy storing device to the first output terminal depending on a first inverted clock signal which is an inverted signal to the first clock signal; and
   a second coupling circuit which couples the first input tap to a second energy storing device depending on a second clock signal and which couples the second energy storing device to the first output terminal depending on a second inverted clock signal which is an inverted signal to the second clock signal.

2. The signal transformation arrangement according to claim 1,
   comprising at least one further coupling circuit which couples the first input tap to at least one further energy storing device depending on at least one further clock signal and which couples the at least one further energy storing device depending on at least one further inverted clock signal which is an inverted signal to the at least one further clock signal to the first output terminal.

3. The signal transformation arrangement according to claim 1, wherein,
   the first and the second clock signal are provided depending on a common clock signal.

4. The signal transformation arrangement according to claim 1, wherein
   the first and the second clock signal are digital signals.

5. The signal transformation arrangement according to claim 1, wherein,
   the first energy storing device comprising a first capacitor and the second energy storing device comprising a second capacitor.

6. The signal transformation arrangement according to claim 5,
   the first coupling circuit comprising a first switch which couples the first input tap to a first electrode of the first capacitor, and a second switch which couples the first electrode of the first capacitor to the first output terminal, and
   the second coupling circuit comprising a third switch which couples the first input tap to a first electrode of the second capacitor, and a fourth switch which couples the first electrode of the second capacitor to the first output terminal.

7. The signal transformation arrangement according to claim 6, comprising
   a second input tap to receive a second input signal;
   a second output terminal to provide a second output signal, wherein
       the first coupling circuit couples the second input tap to a second electrode of the first capacitor depending on the first clock signal and couples the second electrode of the first capacitor to the second output terminal depending on the first inverted clock signal, and
       the second coupling circuit couples the second input tap to a second electrode of the second capacitor depending on the second clock signal and couples the second electrode of the second capacitor to the second output terminal depending on the second inverted clock signal.

8. The signal transformation arrangement according to claim 1, comprising
   an output energy storing device which is coupled to the first output terminal.

9. The signal transformation arrangement according to claim 7, comprising an output energy storing device which is coupled to the first output terminal;
   the output energy storing device comprising an output capacitor which is arranged between the first output terminal and the second output terminal.

10. The signal transformation arrangement according to claim 1, wherein,
    the cross-coupler couples the first input terminal to a second input tap depending on the inverted cross-coupler signal and the second input terminal to the second input tap depending on the cross-coupler signal.

11. The signal transformation arrangement claim 6, wherein,
    the first, the second, the third and the fourth switch each comprises a transistor.

12. The signal transformation arrangement according to to claim 6, wherein
    the first, the second, the third and the fourth switch each comprises a transmission gate.

13. The signal transformation arrangement according to claim 1,
    comprising a timing circuit which is coupled to the first coupling circuit to provide the first clock signal and the first inverted clock signal, and to the second coupling circuit to provide the second clock signal and the second inverted clock signal.

14. A modulation arrangement, comprising:
    a signal transformation arrangement according to claim 1,
    a further signal transformation arrangement according to claim 1, and
    a summation stage comprising a first summation input terminal which is coupled to the first output terminal of the signal transformation arrangement, and comprising a second summation input terminal which is coupled to the first output terminal of the further signal transformation arrangement.

15. A method for signal transformation, comprising the steps of:
    receiving a first signal and a second signal;
    receiving a first input signal which is generated depending on the first signal and a cross-coupler signal as well as depending on the second signal and an inverted cross-coupler signal which is an inverted signal to the cross-coupler signal;

providing the first input signal to a first energy storing device depending on a first clock signal and to a second energy storing device depending on a second clock signal; and providing a first output signal depending on the energy stored in the first energy storing device and a first inverted clock signal which is an inverted signal to the first clock signal, as well as the energy stored in the second energy storing device and a second inverted clock signal which is an inverted signal to the second clock signal.

* * * * *